United States Patent [19]

Yokoyama et al.

[11] Patent Number: 5,242,511
[45] Date of Patent: * Sep. 7, 1993

[54] COPPER ALLOY COMPOSITIONS

[75] Inventors: Akinori Yokoyama, Kurashiki; Tsutomu Katsumata; Hitoshi Nakajima, both of Yokohama, all of Japan

[73] Assignee: Asahi Kasei Kogyo Kabushiki Kaisha, Osaka, Japan

[*] Notice: The portion of the term of this patent subsequent to Feb. 25, 2009 has been disclaimed.

[21] Appl. No.: 768,750
[22] PCT Filed: Feb. 22, 1991
[86] PCT No.: PCT/JP91/00229
§ 371 Date: Oct. 18, 1991
§ 102(e) Date: Oct. 18, 1991
[87] PCT Pub. No.: WO91/13445
PCT Pub. Date: Sep. 5, 1991

[30] Foreign Application Priority Data

Feb. 23, 1990 [JP] Japan ................................ 2-41091

[51] Int. Cl.$^5$ ............................ C22C 5/00; H01B 1/06
[52] U.S. Cl. ..................... 148/430; 148/432; 148/442; 252/511; 252/514; 420/497; 420/502; 420/587
[58] Field of Search ............... 148/430, 432, 442; 252/511, 514; 75/351, 352; 420/497, 502, 587; 428/570

[56] References Cited

U.S. PATENT DOCUMENTS 3,583,930 6/1971 Ehrreich et al. .................. 252/514
5,064,469 11/1991 Mack .................................. 252/514
5,091,114 2/1992 Nakajima et al. ................. 252/514

FOREIGN PATENT DOCUMENTS 58-157001 9/1983 Japan .
59-146103 8/1984 Japan .
61-245406 10/1986 Japan .
62-80907 4/1987 Japan .
3-152177 6/1991 Japan .

*Primary Examiner*—R. Dean
*Assistant Examiner*—Robert R. Koehler
*Attorney, Agent, or Firm*—Jacobson, Price, Holman & Stern

[57] ABSTRACT

A copper alloy composition comprising 100 parts by weight of powder of copper alloy represented by the general formula $Ag_xCu_y$ (wherein x and y are atomic ratio values; $0.001 \leq x \leq 0.999$, $0.001 \leq y \leq 0.999$, $x+y=1$), 5 to 200 parts by weight of one or more organic binders and 0.01 to 100 parts by weight of an additive capable of removing copper oxide; and a paste for screen printing, electromagnetic shielding, an electrically conductive additive, a paste for electrode and a paste for through hole, which are obtained by using said composition.

16 Claims, No Drawings

COPPER ALLOY COMPOSITIONS

TECHNICAL FIELD

The present invention relates to copper alloy composition pastes having high electroconductivity, oxidation resistance and electromigration resistance, and to electric conductors obtained by the use of the pastes. The pastes are useful for electromagnetic shielding, and as electrically conductive adhesives, pastes for conductive circuits, pastes for electrodes, pastes for screen printing, pastes for printing resistance terminals, pastes for through holes, materials for contact, etc.

BACKGROUND ART

As electrically conductive pastes or electrically conductive compositions, dispersions have been obtained by adding an organic binder and optionally a solvent and additives to powder of, for example, any of the following metals: noble metals, such as gold, platinum, palladium, silver, and silver-palladium [for instance, Jap. Pat. Appln. Kokai (Laid-Open) Nos. SHO 56 (1981)-70064, SHO 51 (1976)-124655, SHO 59 (1984)-45355, and HEI 1 (1989)-98674], nickel [for instance, Jap. Pat. Appln. Kokai (Laid-Open) SHO 58 (1983)-53966], silver-plated copper [for instance, Jap. Pat. Appln. Kokai (Laid-Open) Nos. SHO 56 (1981)-8892 and HEI 1 (1989)-231208], and copper [for instance, Jap. Pat. Appln. Kokai (Laid-Open) Nos. SHO 56 (1981)-163166, SHO 62 (1987)-74967, SHO 63 (1988)-89577, SHO 57 (1982)-55974 and HEI 2 (1990)-16172].

The conventional electrically conductive pastes have the following defects. Copper is not expensive but oxidation tends to decrease its electroconductivity. Addition of an antioxidant to paste obtained with copper powder has also been tried. In such case, in an early stage, copper oxide is removed from particle surfaces and electroconductivity can be attained. But, after the paste is made into a coating film, the contact resistance is gradually increased at high temperatures or high humidities, resulting in low electroconductivity. Electrically conductive pastes obtained by the use of silver powder are well known but involve an electromigration problem. Electrically conductive pastes obtained by the use of powder produced by plating copper powder with silver are also well known, but it is difficult to plate fine powder uniformly with silver and these pastes encounter a problem when a plated silver film comes off and an electromigration problem. Furthermore, a local battery cell tends to form between silver and copper, so that copper is easily oxidized. Processes for mechanically alloying silver with, copper forcedly have been disclosed [for example, Jap. Pat. Appln. Kokai (Laid-Open) Nos. SHO 56 (1981)-155259 and SHO 57 (1982)-98572], but are disadvantageous in that because of the mechanical alloying, the processes are not sufficiently effective in preventing the electromigration of silver.

BEST MODE FOR CONDUCTING THE INVENTION

The present invention relates to inexpensive electrically conductive pastes which have an excellent electroconductivity, a high oxidation resistance for a long period of time, and a high electromigration resistance.

One aspect of the present invention is directed to a method for stabilizing an electrically conductive paste for a long period of time, particularly by improving the oxidation resistance and the migration resistance.

Copper alloy powder used in the present invention is produced by atomization. Gas atomization and water atomization are preferable. In particular, inert gas atomization is preferable. For inert gas atomization used in the present invention, the process disclosed by the present inventors in U.S. patent application Ser. No. 07/395531 is preferably employed. This process is as follows. For example, a copper-silver mixture or alloy having a specified composition is melted in a crucible by high-frequency induction heating in an inert atmosphere or in vacuo. In this case, the term "inert atmosphere" means an atmosphere which does not react with the melt at all or reacts therewith very slowly. For instance, an atmosphere composed mainly of nitrogen, helium, hydrogen or argon is preferable. The melt is jetted into an inert gas atmosphere from a nozzle attached to the end of the crucible. Simultaneously with the jetting, the inert gas which has been compressed is thermally adiabatically expanded and the thus-generated high-speed gas stream is jetted against the melt to atomize the melt. The inert gas used here is a gas which does not react with the melt of such a composition at all or reacts therewith very slowly. For example, nitrogen, helium, argon, hydrogen and mixtures thereof are preferable. In this case, the oxygen content of the gas is preferably 2% or less, more preferably 0.1% or less.

The pressure of the gas (immediately before the expansion) is preferably 5 kg/cm$^2$G or more, more preferably 15 kg/cm$^2$G. The speed of the high-speed gas stream is preferably 50 m/sec or more, more preferably 100 m/sec or more, most preferably 300 m/sec or more, at the outlet of a gas nozzle. The mass velocity ratio of the gas to the melt (the mass velocity of the gas/the mass velocity of the melt) is preferably 0.1 or more, more preferably 1 or more. The cooling temperature in this case is preferably not higher than 10$^9$° C./sec and not lower than 10$^2$° C./sec., more preferably not higher than 10$^4$° C./sec and not lower than 10$^7$° C./sec.

When water atomization is employed, a melt of the aforesaid composition is jetted from the end of a nozzle attached to the crucible. Simultaneously with the jetting, pressurized water is jetted from a nozzle against the melt jetted from the end of the crucible, and collides with the melt of the aforesaid composition to make the melt into fine particles. The fine particles are rapidly cooled and solidified. In this case, the ratio of the mass velocity of water to that of the melt is preferably 10 or more, more preferably 40 or more. The speed of water at the outlet of the water nozzle is preferably 80 m/sec or more, more preferably 100 m/sec or more. The pressure at jetting of pressurized water from the end of the nozzle is preferably 50 kg/cm$^2$G or more, more preferably 100 kg/cm$^2$G or more.

As to $Ag_xCu_y$ (wherein x and y are atomic ratio values; $0.001 \leq x \leq 0.999$, $0.001 \leq y \leq 0.999$, $x+y=1$) which is used in the present invention, when x is less than 0.001, sufficient oxidation resistance cannot be attained. When x is more than 0.999, sufficient migration resistance cannot be attained. In the case where $0.001 \leq x \leq 0.4$, the silver concentration in the surface of each of such copper alloy particles used in the present invention is higher than the average silver concentration of the whole particle, and the particle has a region near the surface in which the silver concentration increases with a decrease of the distance to the surface. The silver concentration in the surface is 2.1 times or more as high as the average silver concentration. It is preferably not more than 40 times and not less than 3 times, more preferably not more than 15 times and not less than 4 times. The value x for silver is preferably $0.005 \leq x \leq 0.3$, more preferably $0.01 \leq x \leq 0.25$.

In the copper alloy powder wherein $0.001 \leq x \leq 0.4$ which is used in the present invention, the silver concentration in the surface is higher than the average silver concentration. As disclosed by the present inventors (U.S. patent Application Ser. No. (USSN) 07/395531), a mechanism by which silver having a low melting point is condensed in the surface can be conjectured as follows. For example, fine metal droplets formed by the collision of the melt with the high-speed gas stream are rapidly cooled and solidified while flowing at a high speed in company with the high-speed gas stream. It can be speculated that, in this solidification process, a liquid phase rich in silver with a low melting point is driven out to the surface and solidified later, resulting in production of particles in which silver has been condensed in the surface.

Alloy powder in which the value x for silver exceeds 0.4 ($0.4 < x \leq 0.999$) can be used particularly when oxidation resistance at high temperatures is required. The alloy powder in which the value x for silver exceeds 0.4 has the following advantage. The silver concentration in the surface is high, and silver spreads fairly deep in the inside of each particle, thus preventing an minimizing oxidation of copper. Moreover, since silver in the powder has alloyed with copper, the powder has a high electromigration resistance.

Powder produced by rapid cooling and solidification by water atomization contains a large amount of particles of irregular shape. Such a powder produced by water atomization can be classified as spherical particles in the present invention.

The term "the value x for silver" used in the present specification means Ag/(Ag+Cu) (atomic ratio). The silver concentrations in and near the surface were measured by means of an XPS (KRATOS XSAM 800, an X-ray photoelectron spectrochemical analyzer mfd. by KRATOS CO., LTD.). The term "the value y for copper" means Cu/(Ag+Cu) (atomic ratio).

First, a carbon pressure-sensitive adhesive double-coated tape having electroconductivity was attached to a specimen carrier, and sample powder was gently adhered to the double-coated tape to cover the tape completely, with caution so as not to deform the sample powder. The conditions of measurement of the silver concentrations were as follows. K α-ray of magnesium (voltage 12 KV, current 10 mA) were radiated upon the sample, and the angle of taking out photoelectrons was adjusted to 90° with the surface of the sample. The measurement was carried out at a pressure of $10^{-8}$ torr in a chamber.

Etching was carried out under the following conditions; acceleration voltage of an argon ion gun: 3 keV, the angle of incidence of argon ion beam upon the surface of the sample: 45°, pressure in a chamber: $10^{-7}$ torr, etching time: 10 min.

The silver concentrations were determined by repeating the measurement and the etching alternately five times each, and the average of the first two measurements was taken as the silver concentration in the surface.

The average silver concentration was measured by means of an ICP (an inductively coupled plasma emission spectrochemical analyzer) by using a solution prepared by dissolving the sample in concentrated nitric acid.

The copper alloy powder used in the present invention has an average particle size of from 0.1 to 100 μm. When the average particle size is less than 0.1 μm, the contact resistance is increased, so that the electroconductivity is decreased. When it exceeds 100 μm, the screen printability is decreased. The average particle size is preferably from 0.1 to 50 μm, more preferably from 0.5 to 30 μm. The average particle size was measured by means of a laser diffraction type particle size distribution meter (SALD 1100). This measurement was repeated five times by using a dispersion prepared by dispersing the powder sufficiently in an ethylene glycol solution (powder concentration: 1 to $20 \times 10^{-9}$ g/cc). The average of five measurements as an average value obtained by volume integration was taken as the average particle size.

The shape of particles is preferably a spherical shape, scaly shape or a mixture thereof. When powder composed of scaly particles is prepared, the particles can be mechanically flattened by conventional means. Such means include, for example, stamp mill and ball mill.

The copper alloy powder used in the present invention optionally includes metals and semi-metals, for example, Al, Zn, Sn, Pb, Si, Mn, Bi, Mo, Cr, Ir, Nb, Sb, B, P, Mg, Li, C, Na, Ba, Ti, In, Au, Pd, Pt, Rh, Ru, Zr, Hf, Y, W and La, and compounds thereof at the time of melting so long as they do not deteriorate characteristics of the powder. In addition, the powder of the present invention is optionally used in admixture with powder comprising or consisting of any of numerous metals and semi-metals, for example, Al, Zn, Sn, Pb, Si, Mn, Bi, Mo, Cr, Ir, Nb, Sb, B, P, Mg, Li, C, Na, Ba, Ti, In, Au, Ag, Cu, Pd, Pt, Rh, Ru, Zr, Hf, Y, W and La, and compounds thereof.

According to the present invention, one or more organic binders selected from the group consisting of thermosetting resins, thermoplastic resins, photo-setting resins, electron-beam-setting resins, photo-degradable resins and electron-beam-degradable resins are used. Examples of suitable thermoplastic resins are thermoplastic acrylic resins, alkyd resins, vinyl chloride resins, urethane resins, polyester resins, vinyl chloridevinyl acetate copolymers, vinyl acetate resins, ethylenevinyl acetate copolymers, polycarbonate resins, styrene resins, etc.

As the thermosetting resins, there are preferably used one or more members selected from the group consisting of epoxy resins, phenolic resins, amino resins, alkyd resins, polyurethane resins, polyester resins, thermosetting acrylic resins, polyimide resins, melamine alkyd resins, and modified resins obtained from them.

The epoxy resins include, for example, bisphenol A type epoxy resins with a molecular weight of from 380 to 8,000, epoxy phenolic novolak type resins, epoxy cresol novolak type resins, brominated bisphenol A type epoxy resins, alicyclic epoxy resins, chain epoxy resins, polyalkylene ether type epoxy resins, polyglycidyl ether type epoxy resins, diglycidyl ether type epoxy resins, diglycidyl ester type epoxy resins, dimer acid diglycidyl ester type epoxy resins, epoxyacrylate resins, and modified epoxy resins obtained from them, such as epoxy resins modified at the terminal phenolic hydroxyl group, fatty-acid-modified epoxy resins, and urethane-modified epoxy resins. If necessary, well-known reactive diluents can be used. The diluents include, for example, diglycidyl ether, ethylene glycol diglycidyl ether, 1,3-butanediol diglycidyl ether, butadiene dioxide, diethylene glycol diglycidyl ether, vinylcyclohexane diepoxide, triglycidyl cyanurate, N-diglycidylamine, divinylbenzene diepoxide. The diluents are not limited thereto.

The phenolic resins include novolak type phenolic resins, resol type phenolic resins, alkylphenol resol type resins, xylene-resin-modified resol type resins, resin-modified phenolic resins, etc. Of these, the resol type resins and the modified resol type resins are preferable.

The amino resins include, for example, methylated melamine resins, butylated melamine resins, benzoguanamine resins, urea resins, and butylated urea resins. It is preferable to use the amino resins as cross-linking agents for the thermosetting acrylic resins, the phenolic resins and the epoxy resins.

The polyimide resins include, for example, condensate type polyimides, bismaleimide resins, and adduct type polyimides having an acetylene group or the like at the end of the molecule.

As a curing accelerator, there can, if necessary, be used well-known curing agents, such as organic polyamines, acid anhydrides, dicyandiamide, benzoguanamine, biguanide, alkylphenylbiguanides, diphenylbiguanide, boron trifluoride, amine compounds, etc.

The preferred acrylic resins are those whose functional groups are as follows: the acid value (—COOH) is from 10 to 80 mg/g, particularly preferably from 20 to 75 mg/g, and the hydroxyl value (—OH) is from 40 to 250 mg/g, particularly preferably from 50 to 200 mg/g. For improving the water resistance, it is preferable to use an acrylic resin having a hydroxybutyl group. As to the molecular weight, acrylic resins having a molecular weight of 2,400 or more can be used, though the molecular weight is preferably not more than 16,000 and not less than 4,500.

The average molecular weight of the polyester resins or the alkyd resins is preferably 4,000 or more, more preferably 7,000 or more.

As the polyurethane resins, urethane prepolymers capable of yielding urethane can be used. Polyurethane resins composed mainly of a blocked isocyanate prepolymer obtained by blocking the terminal active isocyanate group with an active-hydrogen compound are preferably used.

When thermosetting resin is used, a heating means includes a box-type hot-air convection furnace, continuous heating furnace, muffle furnace, near-infrared rays furnace, far-infrared rays furnace, vapor phase heating device, etc. Conventional means may be used. Any drying temperature or heat curing temperature may be employed so long as it does not have an undesirable influence on characteristics of a substrate. The drying temperature or the heat curing temperature is suitably and conventionally chosen. Curing may be conducted in air (oxygen content: 20%) or in an atmosphere having a lower oxygen content or containing no oxygen.

The photo-setting resins include ultraviolet-setting resins and visible-ray-setting resins. The ultraviolet-setting resins are preferable. In the case of the ultraviolet-setting resins, it is preferable to use a photopolymerizable oligomer or a photopolymerizable monomer together with a photoinitiator and an assistant of the photoinitiator.

As to the photopolymerizable oligomer, its molecule is a low-molecular-weight reactive molecule (molecular weight: hundreds to thousands). The oligomer has, as functional groups, two or more acrylic or methacrylic groups introduced into its skeleton, such as a polyester skeleton, epoxy skeleton or urethane skeleton. The oligomer includes, for example, epoxyacrylate, urethane acrylate, polyester acrylates and polyether acrylates. The photopolymerizable monomer is one which has in its molecule at least one acryloyl group ($CH_2=CHCO-$) or methacryloyl group ($CH_2=C(CH_3)CO-$). Monofunctional acrylates and methacrylates which have one acryloyl or methacryloyl group, polyfunctional acrylates having two or more acryloyl or methacryloyl groups, and reactive monomers having a vinyl group ($CH_2=CH-$) are preferably used. The monofunctional acrylates and methacrylates include, for example, allyl acrylate, allyl methacrylate, benzyl acrylate, benzyl methacrylate, isobornyl acrylate, cyclohexyl acrylate, cyclohexyl methacrylate, N,N-dimethylaminoethyl acrylate, glycidyl methacrylate, lauryl acrylate, polyethylene acrylate 90 methacrylate, and trifluoroethyl methacrylate. The polyfunctional acrylates include, for example, 1,4-butanediol diacrylate, 1,6-hexandediol diacrylate, diethylene glycol diacrylate, neopentyl glycol acrylate, polyethylene glycol (400) diacrylate, tripropylene glycol diacrylate, bisphenol A diethoxydiacrylate, tetraethylene glycol diacrylate, trimethylolpropane triacrylate, and pentaerythritol triacrylate. Monofunctional monomers, such as styrene, vinyltoluene, vinyl acetate, N-methylpyrrolidone, etc, can be used as the reactive monomers having a vinyl group.

Substances which tend to absorb ultraviolet light to produce a radical are preferably used as the photoinitiator used together with the oligomer or the monomer. Well-known photoinitiators of the acetophenone type, thioxane type, benzoin type and peroxide type are optionally used. The photoinitiator includes, for example, diethoxyacetophenone, 4-phenoxydichloroacetophenone, benzoin, benzoin ethyl ether, benzoin isopropyl ether, benzyl dimethyl ketal, benzophenone, 4-phenylbenzophenone, acrylated benzophenone, thioxanthone, and 2-ethylanthraquinone.

The photoinitiator assistant useful in the present invention is one which is not itself activated by ultraviolet irradiation, but which makes the curing reaction efficient because its simultaneous use with the photoinitiator accelerates initiation reaction more markedly than employment of the photoinitiator alone. Well-known photoinitiator assistants, such as aliphatic and aromatic amines, for example, triethanolamine, N-methyldiethanolamine, Michler's ketone and 4,4-diethylaminophenone, are useful for this purpose.

As to a curing method, for example, a coating film formed by coating at room temperature or at a higher temperature, preferably at from 40° to 80° C., is irradiated with light by using an ultraviolet-emitting apparatus comprising a mercury lamp, as a light source. As the light source, a well-known apparatus may be used. A light source of 100 watt/cm or more is preferable. A sufficient irradiation time is from several seconds to several tens of seconds. Preferable resins include polyester acrylate resins, epoxyacrylate resins, and polyurethane acrylate resins.

Exemplary electron-beam-setting resins include the above-exemplified photo-setting resins (photopolymerizable oligomers and photopolymerizable monomers).

When curing is conducted by means of an electron beam, electrons accelerated at a high voltage have a high curing capability because of their high energy and higher penetrability than that of light; moreover, they permit curing at room temperature. In addition, since the aforesaid oligomer or monomer absorbs the electron beam to generate ions or a radical, the photoinitiator and the photoinitiator assistant are not necessary in principle. Electron beam curing may be carried out by a conventional method. For example, when the coating film thickness is 100 μm or less, an accelerating voltage of 150 kV or more is preferable and a conventional method can be employed.

The copper alloy composition of the present invention contains organic binder(s) in an amount of from 5 to 200 parts by weight per 100 parts by weight of the copper alloy powder. When the amount of the organic binder(s) is less than 5 parts by weight, the amount of resin contained in the composition is insufficient to bind the electrically conductive metal powder in a coating film, so that the electroconductivity and the mechanical strength are decreased. When the amount of the organic binder(s) exceeds 200 parts by weight, the amount (concentration) of the electrically conductive metal powder is inadequate to attain desired electroconductivity. The amount of the organic binder(s) is preferably from 5 to 100 parts by weight, more preferably from 5 to 50 parts by weight.

When the copper alloy composition of the present invention is used, a solvent is optionally included therein. Such solvent is preferably contained in the composition in an amount of from 0 to 100 parts by weight, inclusive, per 100 parts by weight of the sum of the copper alloy powder and the organic binder(s). Well-known solvents are useful, and they naturally depend on the particular resin. Preferred solvents include aromatic compounds, such as toluene, xylene, etc; ketones, such as methyl ethyl ketone, methyl isobutyl ketone, etc.; esters, such as butyl acetate, ethyl acetate, etc.; ethers, such as ethylene glycol monomethyl ether, ethylene glycol monoethyl ether, ethylene glycol monobutyl ether, ethylene glycol dimethyl ether, ethylene glycol mono-n-butyl ether, ethylene glycol mono-n-hexyl ether, ethylene glycol monoallyl ether, ethylene glycol dodecyl ether, ethylene glycol monoisobutyl ether, ethylene glycol monoisopropyl ether and its acetate, diethylene glycol monomethyl ether, diethylene glycol monoethyl ether, diethylene glycol monobutyl ether, diethylene glycol monoisobutyl ether, diethylene glycol dodecyl ether, diethylene glycol monohexyl ether and its acetate, diethylene glycol dimethyl ether, diethylene glycol diethyl ether, diethylene glycol dibutyl ether, triethylene glycol monomethyl ether, triethylene glycol dodecyl ether, triethylene glycol mono-n-butyl ether and its acetate, triethylene glycol dimethyl ether, etc.; alcohols, such as α-terpineol, β-terpineol, isopropanol, butanol-benzyl alcohol, alkylbenzyl alcohols, etc.; phenols, such as phenol, chlorophenol, etc.; dioxane; dimethylacetamide; dimethylformamide; N-methylpyrrolidone; and γ-lactone.

The copper alloy composition of the present invention contains at least one additive capable of removing copper oxide, in an amount of 0.01 to 50 parts by weight per 100 parts by weight of the copper alloy powder. The additive can reduce copper oxide on the surfaces of particles constituting the powder, or can dissolve the copper oxide to remove the same from the surfaces. The mechanism of electric conduction of the copper alloy composition of the present invention is such that the composition has electroconductivity by virtue of contacts between particles. Therefore, characteristics of the surfaces of the particles are important. In the copper alloy powder used in the present invention silver is contained in the surfaces of the particles, and silver contacts between the particles are sufficiently secured by removing or reducing the copper oxide present in such surfaces. Accordingly, the composition is stable for a long period of time with respect to oxidation resistance of the surfaces of the particles at high temperatures or high humidities.

On the other hand, in conventional pastes obtained by the use of copper powder, even when surface treatment with an oxide-removing agent is carried out, newly formed contacts are copper-copper contacts. Therefore, when the pastes are kept at high temperatures or high humidities for a long period of time, the surfaces of particles constituting the copper powder are oxidized, resulting in gradual deterioration of the electroconductivity. In the case of conventional pastes obtained by the use of silver powder, the addition of the additive used in the present invention causes adsorption of the additive on the surfaces of particles constituting the silver powder, so that the contact resistance of the particles is increased, resulting in low electroconductivity.

As to the amount of the additive used, when it is less than 0.1 part by weight, insufficient electro-conductivity can be attained. When it exceeds 50 parts by weight, the additive is adsorbed on the surfaces of the particles to decrease the electroconductivity. Therefore, it is preferable to add the additive in an amount required on the basis of the amount of copper oxide present in the surfaces of the particles. The amount is preferably from 1 to 50 parts by weight, more preferably from 1 to 30 parts by weight.

Suitable additives according to the present invention include one or more members selected from the group consisting of fatty acids, dicarboxylic acids, oxycarboxylic acids and metal salts thereof, phenol compounds, metal-chelate-forming agents, higher fatty amines, organotitanium compounds, rosin, and anthracene and derivatives thereof.

The fatty acids include saturated fatty acids (e.g. acetic acid, propionic acid, butyric acid, valeric acid, caproic acid, enanthic acid, caprylic acid, lauric acid, tridecylic acid, myristic acid, pentadecylic acid, heptadecylic acid, stearic acid, nonadecanoic acid, arachic acid and behenic acid), unsaturated fatty acids (e.g. acrylic acid, oleic acid, elaidic acid, cetoleic acid, erucic acid, brassidic acid, sorbic acid, linolic acid, arachidonic acid and stearolic acid), and metal salts thereof (e.g. copper salts, iron salts, magnesium salts, manganese salts and silver salts). In this case, for forming a coating film having high adhesive properties, metal salts of higher fatty acids, or fatty acids having 13 or less carbon atoms and metal salts thereof are preferably used.

The dicarboxylic acids include saturated aliphatic dicarboxylic acids (e.g. oxalic acid, malonic acid, succinic acid, glutaric acid, adipic acid, pimelic acid, suberic acid, azelaic acid and sebacic acid), unsaturated aliphatic dicarboxylic acids (e.g. maleic acid and fumaric acid), aromatic dicarboxylic acids (e.g. phthalic acid, isophthalic acid and terephthalic acid), metal salts thereof (e.g. copper salts, iron salts, magnesium salts, manganese salts and silver salts), and anhydrides thereof.

The oxycarboxylic acids include aliphatic oxycarboxylic acids (e.g. glycolic acid, lactic acid, hydroacrylic acid, α-oxybutyric acid, glyceric acid, tartronic acid, tartaric acid and citric acid), aromatic oxycarboxylic acids (e.g. salicyclic acid, p- and m-oxybenzoic acid, mandelic acid, tropic acid, oxyphenylacetic acid, resorcylic acid, orsellinic acid, gentisic acid, protocatechuic acid, caffeic acid and umbellic acid), metal salts thereof. The metal includes copper, manganese, silver, iron, magnesium, cobalt, etc. There are preferably used mandelic acid, citric acid, salicyclic acid, resorcylic acid, and p- and m-oxybenzoic acid.

The phenol compounds include monohydric, dihydric and trihydric phenols and derivatives thereof, for example, phenol, cresol, 3,5-xylenol, carvacrol, thymol, naphthol, catecol, resorcin, hydroquinone, methylhydroquinone, tert-butylhydroquinone, chlorohydroquinone, phenylhydroquinone, 1,2,4-benzenetriol, pyrogallol, and fluoroglucitol.

The metal chelate forming agents include, for example, amino alcohols (e.g. ethanolamine, diethanolamine, triethanolamine, and derivatives thereof), amine compounds (e.g. ethylenediamine, triethylenediamine and triethylenetetramine), and acetylacetone and its derivatives (e.g. trifluoroacetylacetone, hexafluoroacetylacetone and benzylacetone).

The higher fatty amines are preferably those having 8 to 22 carbon atoms which are soluble in solvents. They include, for example, saturated monoamines, such as stearylamine, palmitylamine, behenylamine, cetylamine, octylamine, decylamine, laurylamine, etc.; and unsaturated monoamines, such as oleylamine, etc.; diamines, such as stearylamine, propylenediamine, oleylpropylenediamine, etc.

As the organotitanium compounds, there can be exemplified $R_1$-Ti-$(R_2)_3$ (wherein $R_1$ is an alkoxy group having 1 to 4 carbon atom, preferably 1 to 3 carbon atoms, and $R_2$ is a carboxylic acid ester having 2 to 20 carbon atoms, preferably 2 to 18 carbon atoms). Specific examples of the organotitanium compounds are isopropyltriisostearoyl titanate and isopropyltrioctanoyl titanate.

The anthracene and derivatives thereof include, for example, anthracenecarboxylic acid.

The rosin includes, for example, modified rosins, such as partially hydrogenated rosin, completely hydrogenated rosin, esterified rosin, maleinated rosin, disproportionated rosin, polymerized rosin, etc.

As to the amount of the additive, one or more additives selected from the above-exemplified additives are added in an amount of from 0.1 to 50 parts by weight per 100 parts by weight of the copper alloy powder. When the amount is less than 0.1 part by weight, sufficient electroconductivity cannot be attained. When the amount exceeds 50 parts by weight, bleeding from a coating film occurs, so that electroconductivity is decreased. The amount is preferably from 1 to 50 parts by weight, more preferably from 1 to 30 parts by weight.

The copper alloy composition of the present invention provides an electrically conductive paste having high electroconductivity and electromigration resistance. Needless to say, when the composition is used, well-known additives, such as viscosity adjustors, diluents, suspending agents, leveling agents, anti-foaming agents, silane coupling agents, titanium coupling agents, aluminum coupling agents, etc., are optionally incorporated therein.

The copper alloy composition of the present invention is useful in conventional printing methods and coating methods, for example, screen printing, spray coating, brush coating, bar coating, doctor blade coating, Flexshar printing, micro dispenser coating, gravure printing, offset printing, pen writing method, etc. Of these, screen printing is preferable. When screen printing is employed, the screen mesh is preferably from 50 to 400 mesh, more preferably from 150 to 400 mesh. For printing fine lines, a screen mesh of 200 mesh or more is particularly preferable.

As a substrate on which the copper composition of the present invention is printed, well-known substrates can be used. The composition can be applied, for example, on hard or flexible substrates composed of a glass-epoxy resin substrate, paper-phenolic resin substrate, paper-epoxy resin substrate, polyimide resin substrate, polyester resin substrate, BT resin substrate, polysulfone resin substrate, polyether-sulfone resin substrate, polyether-imide resin substrate, polybutadiene resin substrate, polyphenylene ether resin substrate, polyphenylene sulfide resin substrate, or glass-polyimide resin substrate; ceramic substrates, such as an alumina substrate, aluminum nitride substrate, etc.; metal substrates, such as an aluminum substrate, a stainless steel substrate, an enamel substrate, etc. When the composition is applied on a flexible substrate made of polyimide, polyester or the like, the composition is preferably a copper alloy composition with a binder composed mainly of a vinyl resin (e.g. a vinyl chloride-vinyl acetate copolymer) or a saturated polyester or polyurethane type resin.

When the copper alloy composition of the present invention is used as a paste for electromagnetic shielding, it is preferable to print the composition on the surface of a substrate for printed circuit to achieve shielding. The composition is useful for coating plastic boxes of word processors, housings for machinery and tools for computers, card readers, measuring instruments, car telephones, keyboards, medical instruments, musical instruments, CRT, etc.

When the copper alloy composition of the present invention is used as an electrically conductive additive, it can be used, for example, as an adhesive for taking out a lead wire from the electrode of a quartz crystal oscillator, an adhesive for adhesion between molded carbon and a metal, an electrically conductive adhesive for adhesion between glass Portions in a liquid crystal display (LCD), an adhesive for adhering elements of IC, LSI, LED, SAW filter or the like to a lead frame or a substrate (in particular, an adhesive for IC die bonding), an adhesive for the Cds part of a photoconductive element and the lead wire of a potentiometer, an adhesive for circuit repair and materials which cannot be directly soldered, and an adhesive for materials which cannot be heated at a high temperature.

When the copper alloy composition described above is used in through holes, the inner walls and intermediate edges of the through holes which have been formed in a printed circuit board by punching or the like are covered with the composition, or the holes are filled with the composition. In this case, screen printing or Flexshar printing is preferably employed. For filling the holes sufficiently with the composition, it is preferable to reduce the pressure to some extent on the side reverse to the side on which the printing is conducted.

The electroconductivity (volume resistivity) of a coating film formed of the copper alloy composition of the present invention was measured by a four-probe technique. A electromigration test was carried out in the following manner. A voltage of 10 V was applied between two coating films formed at a distance of 1 mm from each other, and 0.2 ml of a water drop was added between the films. Then, the leakage current was measured, and the time required for the current to exceed 100 μm was called "migration time".

As endurance tests, there were carried out a test of the change of electroconductivity after standing at 60° C. and 90% RH (a humidity resistance test), and a soldering heat resistance test (the change of electroconductivity after dipping in Sn/Pb solder bath at 260° C. for 10 seconds). The adhesive properties of a film were judged by a cross-cut adhesion test.

As to electromagnetic interference shielding characteristics, the shielding effect in the frequency range of 100 kHz to 1 GHz was measured by using a wave guide, a spectroanalyzer and a tracking generator, and the results obtained were expressed in decibels (dB). The electromagnetic interference shielding characteristics are preferably at least 30 dB.

Electroconductive characteristics for through holes were examined in the following manner. Each composition was printed by screen printing (320 mesh) under pressure on a paper-phenol resin substrate having 30 holes of 1.5, 1, 0.5 and 0.3 mm$\phi$ formed by reducing the pressure to some extent on the side reverse to the side on which printing is conducted, so as to fill up the holes completely. After heating, the composition was cured by a method suitable for the composition.

If necessary, a cured product of the composition of the present invention can be trimmed by means of a laser or the like.

The present invention provides a copper alloy composition having high electroconductivity, oxidation resistance and electromigration resistance. This composition has excellent characteristics as a paste for electromagnetic shielding, an electrically conductive additive, a paste for conductive circuit, an electrically conductive paste for electrode, and a paste for through hole.

EXAMPLES

Examples of Powder Production

Example 1

In a graphite crucible, 315.595 g of copper particles (average particle size 2 mm; hereinafter the same applied) and 3.237 g of silver particles (average particle size 2 mm; hereinafter the same applied) were melted by high-frequency induction heating. Melting was conducted in an atmosphere comprising 99.9% or more of nitrogen. The copper and silver particles were heated up to 1720° C., after which nitrogen gas (99.9% or more) with a pressure of 15 k/cm$^2$ was jetted against melt falling from a nozzle attached to the end of the crucible, at a mass velocity ratio of the gas to the melt of 1 to atomize the melt. The linear velocity of the gas at the outlet of a gas nozzle was 80 m/sec. The powder thus obtained had an average particle size of 20 μm.

As a result of measurement by XPS, the following was found. The silver concentration varied from 0.05, to 0.04, to 0.03, to 0.02 and to 0.01, starting from the surface. The silver concentration in the surface was 0.045. The average silver concentration was x=0.006. The average copper concentration was y=0.994. The silver concentration in the surface was 7.5 times as high as the average silver concentration.

Example 2

In the same manner as in Example 1, 314.325 g of copper particles and 5.395 g of silver particles were melted by high-frequency induction heating. The copper and silver particles were heated up to 1680° C. to be melted, after which nitrogen gas (99.7% or more) with a pressure of 20 k/cm$^2$G was jetted against a melt jetted from the end of a nozzle, at a mass velocity ratio of the gas to the melt of 1.5 to atomize the melt. In this case, the linear velocity of the gas at the outlet of a gas nozzle was 120 m/sec. The powder thus obtained was composed of spherical particles having an average particle size of 19 μm.

The silver concentrations near the surface were 0.07, 0.06, 0.05, 0.04 and 0.03, starting from the surface. The silver concentration in the surface was 0.065. The average silver concentration was x=0.01. The average copper concentration was y=0.99. The silver concentration in the surface was 6.5 times as high as the average silver concentration.

Example 3

In the same manner as in Example 1, 285.75 g of copper particles and 53.95 g of silver particles were melted in a graphite crucible. The copper and silver particles were heated up to 1570° C. to be melted, after which the melt was jetted from the end of the crucible, and at the same time, nitrogen gas (99.9% or more) was jetted with a pressure of 20 k/cm$^2$G against the melt at a mass velocity ratio of the gas to the melt of 2 to atomize the melt. In this case, the linear velocity of the gas at the outlet of a gas nozzle was 100 m/sec, and the powder thus obtained had an average particle size of 19 μm. The silver concentrations near the surface were 0.72, 0.65, 0.55, 0.5 and 0.48, starting from the surface. The silver concentration in the surface was 0.685. The average silver concentration was x=0.1. The average copper concentration was y=0.9. The silver concentration in the surface was 6.85 times as high as the average silver concentration.

Example 4

In the same manner as in Example 1, 254 g of copper particles and 107.9 g of silver particles were melted by high-frequency induction heating. The copper and silver particles were heated up to 1800° C., after which nitrogen gas (99.9% or more) was jetted with a pressure of 15 k/cm$^2$G against the melt jetted from the end of a crucible into an inert atmosphere (nitrogen), at a mass velocity ratio of the gas to the melt of 2 to atomize the melt. In this case, the linear velocity of the gas at the outlet of a gas nozzle was 80 m/sec. The powder thus obtained had an average particle size of 20 μm.

The silver concentrations near the surface were 0.8, 0.75, 0.7, 0.65 and 0.6, starting from the surface. The silver concentration was 0.775. The average silver concentration was x=0.2. The average copper concentration was y=0.8. The silver concentration in the surface was 3.85 times as high as the average silver concentration.

Example 5

In the same manner as in Example 1, 206.375 g of copper particles and 188.825 g of silver particles were heated up to 1500° C. by high-frequency induction heating to be melted. Then, the melt was jetted into an inert atmosphere (nitrogen) from the end of a crucible. Simultaneously with the jetting, nitrogen gas (99.9% or more) was jetted with a gas pressure of 15 k/cm²G against the melt at a mass velocity ratio of the gas to the melt of 2 to atomize the melt. In this case, the linear velocity of the gas at the outlet of a gas nozzle was 90 m/sec. The powder thus obtained had an average particle size of 18 μm.

The silver concentrations near the surface were 0.88, 0.8, 0.75, 0.7 and 0.65, starting from the surface. The silver concentration in the surface was 0.84. The average silver concentration was $x=0.35$. The average copper concentration was $y=0.65$. The silver concentration in the surface was 2.4 times as high as the average silver concentration.

Example 6

In the same manner as in Example 1, 127 g of copper particles and 323.7 g of silver particles were heated up to 1600° C. to be melted. The melt was jetted into an inert atmosphere (nitrogen) from the end of a crucible. Simultaneously with the jetting, nitrogen gas (99.9% or more) was jetted with a gas pressure of 30 k/cm²G against the melt at a mass velocity ratio of the gas to the melt of 0.7 to atomize the melt. In this case, the linear velocity of the gas at the outlet of a gas nozzle was 150 m/sec at the collision position. The powder thus obtained had an average particle size of 16 μm. It has an average silver concentration of $x=0.6$ and an average copper concentration of $y=0.4$.

Example 7

In the same manner as in Example 1, 63.5 g of copper particles and 431.6 g of silver particles were heated up to 1700° C. by high-frequency induction heating to be melted. The melt was jetted into an inert atmosphere from the end of a crucible. Simultaneously with the jetting, nitrogen gas (99.9% or more) was jetted with a gas pressure of 40 k/cm²G against the melt at a velocity ratio of the gas to the melt of 2.1 to atomize the melt. In this case, the linear velocity of the gas at the outlet of a gas nozzle was 160 m/sec. The powder thus obtained had an average particle size of 14 μm. It had an average silver concentration of $x=0.8$ and an average copper concentration of $y=0.2$.

Example 8

In the same manner as in Example 1, 9.525 g of copper particles and 523.315 g of silver particles were heated up to 1800° C. by high-frequency induction heating to be melted. The melt was jetted from the end of a crucible, and, at the same time, nitrogen gas (99.9% or more) was jetted with a gas pressure of 50 k/cm²G against the melt at a mass velocity ratio of the gas to the melt of 2.3 to atomize the melt. In this case, the linear velocity of the gas at the outlet of a gas nozzle was 180 m/sec at the collision position. The powder thus obtained had an average particle size of 13 μm. It had an average silver concentration of $x=0.97$ and an average copper concentration of $y=0.03$.

Examples of Paste

Example 9

With 10 g of particles with a particle size of 10 μm or less (average particle size: 5 μm) among particles consituting the power ($x=0.006$, $Y=0.994$) obtained in Example 1 were thoroughly mixed 3 g of alkylated phenol, 0.1 g of copper linoleate, 0.5 g of pyrocatechol and 3 g of butyl carbitol. The resulting mixture was applied on a glass-epoxy resin substrate by screen printing (250 mesh). The coating film thus formed was heat-cured at 160° C. for 20 minutes. The cured coating film had a volume resistivity of $1\times10^{-4}$ Ω.cm. The migration time was 295 seconds which was the same as in the case of copper. In addition, a humidity resistance test was carried out (60° C., 90% RH) to find that the percentage change after 1,000 hours was 20%. The result of the cross-cut adhesion test in accordance with JIS K5400 (1979) was 100/100 (namely, no piece peeled off).

Example 10

With 10 g of particles with a particle size of 15 μm or less among particles constituting the powder ($x=0.01$, $y=0.99$) obtained in Example 2 were thoroughly mixed 2 g of a fatty-acid-modified epoxy resin, 1 g of methylated melamine, 0.5 g of maleic acid, 0.05 g of lauric acid, 0.2 g of pyrocatechol and 3 g of butyl carbitol acetate. The resulting mixture was applied on a glass-epoxy resin substrate by screen printing. The coating film thus formed was heat-cured at 170° C. for 30 minutes. The cured coating film had a volume resistivity of $1=10^{-4}$ Ω.cm. The result of the migration test was 295 seconds which was the same as in the case of copper. As a result of a humidity resistance test, the percentage change after 1,000 hours was found to be 20% or less. The result of the cross-cut adhesion test was 100/100.

Example 11

With 10 g of particles with particle size of 15 μm or less among particles consituting the power ($x=0.1$, $y=0.9$) obtained in Example 3 were thoroughly mixed 4 g of a resol type phenol resin, 0.7 g of mandelic acid, 0.3 g of triethanolamine and 4 g of butyl Cellosolve. The resulting mixture was applied on a glass-epoxy resin substrate by screen printing. The coating film thus formed was heat-cured at 150° C. for 30 minutes in air. The cured coating film had a volume resistivity of $8=10^{-5}$ Ω.cm. The result of the migration test was 290 seconds which was substantially the same as in the case of copper. As a result of a humidity resistance test, the percentage change was found to be 10% or less even after standing for 1,000 hours. The result of the cross-cut adhesion test was 100/100.

Example 12

With 10 g of particles with a particle size of 15 μm or less among particles constituting the power ($x=0.1$, $y=0.9$) obtained in Example 3 were thoroughly mixed 5 of a thermoplastic acrylic resin, 0.1 g of isopropyltriisostearoyl titanate and 4 g of MEK. The resulting mixture was applied on a paper-phenol resin substrate by spraying. After the application, the substrate was dried at 40° C. for 2 days. After the drying, the volume resistivity was $9=10^{-5}$ Ω.cm, and the migration time was 290 seconds which was substantially the same as in the case of copper. In addition, as a result of a humidity resistance test, the percentage change after standing for 1,000 hours was found to be 5% or less. The result of the cross-cut adhesion test was 100/100.

Example 13

With 10 g of particles with a particle size of 15 μm or less among particles constituting the powder ($x=0.1$, $y=0.9$) obtained in Example 3 were thoroughly mixed 3.1 g of an addition type polyimide, 0.6 g of oleylamine, 0.3 g of pyrocatechol, 2 g of N-methylpyrrolidone and 2 g of triethylene glycol butyl ether. The resulting mixture was applied on an aluminum substrate. The coating film thus formed was heat-cured at 200° C. for 15 minutes in air. The volume resistivity after the curing was $1.5 \times 10^{-4}$ Ω.cm. The migration time was 290 seconds. As a result of a humidity resistance test, the percentage change was found to be 6% or less. The result of the cross-cut adhesion test was 100/100.

In addition, a 10 cm × 10 cm × 50 μm coating film was formed on a glass-epoxy resin substrate in the same manner as described above. After standing at 60° C. and 90% RH for 1,000 hours, the shielding characteristics in the frequency range of 100 kHz to 1 GHz were measured. Consequently, a marked shielding effect of 50 dB was obtained at 300 MHz.

Example 14

With 10 g of particles with a particle size of 15 μm or less among particles constituting the powder ($x=0.2$, $y=0.8$) obtained in Example 4 were thoroughly mixed 2 g of a novolak type phenolic resin, 2 g of a fatty-acid-modified epoxy resin, 0.01 g of mandelic acid, 0.05 g of pyrocatechol, 0.01 g of titanium coupling agent, 2 g of ethyl acetate and 3 g of ethyl Cellosolve. The resulting mixture was applied on a glass-epoxy resin substrate. The coating film thus formed was heat-cured at 155° C. for 20 minutes. The cured coating film had a volume resistivity of $6 \times 10^{-5}$ Ω.cm. The migration time was 285 seconds. As a result of a humidity resistance test, the percentage change after standing for 1,000 hours was found to be 1% or less.

Example 15

With 10 g of particles with a particle size of 15 μm or less among particles constituting the powder ($x=0.2$, $y=0.8$) obtained in Example 4 were thoroughly mixed 2 g of an epoxy-modified polyimide resin, 1 g of pyrogallol, 1 g of diethanolamine, 0.01 g of silane coupling agent and 2 g of butyl carbitol. The resulting mixture was applied on a glass-epoxy resin substrate by screen printing. The coating film thus formed was heat-cured at 230° C. for 15 minutes in air. The cured coating film had a volume resistivity of $8 \times 10^5$ Ω.cm. The migration time was 285 seconds. As a result of a humidity resistance test, the percentage change after 1,000 hours was found to be 1% or less. The result of the cross-cut adhesion test was 100/100.

A composition prepared in the same manner as described above was introduced into the through holes of 1, 0.5 and 0.3 mmφ of a paper-phenolic resin substrate by screen printing (250 mesh) under a vacuum of 700 mg while pulling the substrate from the side reverse to the side on which the screen printing was conducted. Then, the composition was heat-cured at 230° C. for 10 minutes. The cured product filled up the through holes completely and had such a high electroconductivity that its electric resistance was 0.01 Ω between the obverse and reverse of the substrate.

Example 16

With 10 g of particles with a particle size of 20 μm or less among particles constituting the powder ($x=0.2$, $y=0.8$) obtained in Example 4 were thoroughly mixed 6 g of a bisphenol A type epoxy resin, 1 g of a resol type phenolic resin, 3 g of methylhydroquinone and 4 g of butyl Cellosolve acetate. The resulting mixture was applied by screen printing on a glass-epoxy resin substrate having carbon resistors printed thereon, as a circuit for connecting the resistors to each other. The coating film thus formed was heat-cured at 160° C. for 15 minutes. The volume resistivity of the cured film was $9 \times 10^{-5}$ Ω.cm, and carbon resistors were not changed. For measuring migration, in the same manner as above, the same composition as prepared in the above was applied, and a cured film was formed. Consequently, the migration time was 285 seconds. As a result of a humidity resistance test, the percentage change was found to be 2% or less. The result of the cross-cut adhesion test was 100/100.

Example 17

With 10 g of particles with a particle size of 10 μm or less among particles constituting the powder ($x=0.35$, $y=0.65$) obtained in Example 5 were thoroughly mixed 1 g of an epoxy resin modified at the terminal hydroxyl group, 2 g of a butylated melamine resin, 0.2 g of hydroquinone, 0.1 g of ethanolamine and 3 g of butyl carbitol acetate. The resulting mixture was applied on an aluminum substrate by screen printing. The coating film thus formed was heat-cured at 180° C. for 30 minutes. The cured film had a volume resistivity of $2 \times 10^{-4}$ Ω.cm. The migration time was 260 seconds. In addition, the percentage change after a humidity resistance test was 1% or less.

Example 18

With 10 g of particles with a particle size of 10 μm or less among particles constituting the powder ($x=0.35$, $y=0.65$) obtained in Example 5 were thoroughly mixed 3 g of a liquid epoxy resin, 0.1 g of triethanolamine and 0.1 g of methylhydroquinone. The resulting mixture was applied on a glass-polyimide resin substrate. The coating film thus formed was heat-cured at 140° C. for 30 minutes. The cured film had a volume resistivity of $2 \times 10^{-4}$ Ω.cm. The migration time was 260 seconds. As a result of a humidity resistance test, the percentage change after 1,000 hours was found to be 4% or less. The result of the cross-cut adhesion test was 100/100.

Example 19

With 10 g of particles with a particle size of 10 μm or less among particles constituting the powder ($x=0.35$, $y=0.65$) obtained in Example 5 were thoroughly mixed 2 g of epoxyacrylate, 0.5 g of copper palmitate, 1 g of phenol and 2 g of butyl Cellosolve in a kneader. The resulting mixture was applied on a polyimide resin substrate. The coating film thus formed was cured by means of an electron beam. At the same time, the coating film was heated at 200° C. for 1 minute. The cured coating film had a volume resistivity of $1 \times 10^{-4}$ Ω.cm. The migration time was 260 seconds. As a result of a humidity resistance test, the percentage change after standing for 1,000 hours was found to be 5% or less. The result of the cross-cut adhesion test was 100/100.

Example 20

With 10 g of particles with a particle size of 10 μm or less among particles constituting the powder ($x=0.6$, $y=0.4$) obtained in Example 6 were thoroughly mixed 2 g of epoxyacrylate, 0.1 g of a photopolymerization initiator (benzophenone), 0.1 g of pyrocatechol, 0.1 g of organotitanate and 1 g of MEK. The resulting mixture was applied on a polysulfone resin substrate and ultraviolet-cured. At the same time, the mixture was heated at 200° C. for 5 minutes. The coating film thus formed had a volume resistivity of $8 \times 10^{-5}$ Ω.cm. The migration time was 230 seconds. As a result of a humidity resistance test, the percentage change after standing for 1,000 hours was found to be 1 or less. The result of the cross-cut adhesion test was 100/100.

Example 21

With 10 g of particles with a particle size of 10 μm or less among particles constituting the powder (x=0.8, y=0.2) obtained in Example 7 were thoroughly mixed 4 g of a thermoplastic acrylic resin, 0.1 g of sebacic acid and 4 g of ethyl Cellosolve. The resulting mixture was applied on a flexible polyester resin substrate. The coating film thus formed was dried by heating at 70° C. for 2 days. The volume resistivity of the coating film after the drying was $6 \times 10^{-5}$ Ω.cm. The migration time was 180 seconds. As a result of a humidity resistance test, the percentage change after standing for 1,000 hours was found to be 1% or less. The result of the cross-cut adhesion test was 100/100.

Example 22

With 10 g of particles with a particle size of 10 μm or less among particles constituting the powder (x=0.98, y=0.02) obtained in Example 8 were thoroughly mixed 3 g of a resol type phenolic resin, 0.1 g of rosin, 0.1 g of L-ascorbic acid, 0.1 g of stearylamine and 3 g of butyl carbitol. The resulting mixture was applied on a polyimide resin substrate by screen printing. The coating film thus formed was heat-cured at 150° C. for 20 minutes in helium. The volume resistivity was $5 \times 10^{-5}$ Ω.cm. The migration time was 50 seconds. As a result of a humidity resistance test, the percentage change after standing for 1,000 hours was found to be 2% or less. The result of the cross-cut adhesion test was 100/100.

Example 23

With 10 g of particles with a particle size of 10 μm or less among particles constituting the powder (x=0.01, y=0.99) obtained in Example 2 were thoroughly mixed 1 g of a commercial polyester resin, 0.5 g of a commercial alkyd resin, 1 g of a methylated melamine resin, 2 g of butyl Cellosolve, 0.5 g of toluene, 0.7 g of citric acid, 0.5 g of stearylamine, 0.01 g of a titanium coupling agent and 0.9 g of pyrocatechol. The resulting mixture was applied on a glass-polyimide resin substrate by screen printing. The coating film thus formed was heat-cured at 150° C. for 20 minutes in nitrogen. The cured film had a volume resistivity of $1 \times 10^{-4}$ Ω.cm. The result of the migration test was 250 seconds. As a result of a humidity resistance test, the percentage change after 1,000 hours was found to be 10% or less. The result of the cross-cut adhesion test was 100/100.

Example 24

With 10 g of particles with a particle size of 15 μm or less among particles constituting the powder (x=0.2, y=0.8) obtained in Example 4 were thoroughly mixed 2 g of a liquid epoxy resin (AER 337, mfd. by Asahi Chemical Industry Co.) and 0.5 g of triethanolamine. Using the resulting mixture as an adhesive, die bonding of IC was carried out. Heat curing was conducted at 150° C. for 10 minutes in nitrogen. The cured film thus obtained had such high adhesive properties that no peeling was observed. In the same manner as described above, two glass sheets for use in liquid crystal displays were stuck together with an adhesive of the composition obtained in the above. Electrically conductive contacts after heat curing were all satisfactory.

Example 25

With 10 g of particles with a particle size of 10 μm or less among particles constituting the powder (x=0.2, y=0.8) obtained in Example 4 were thoroughly mixed 2 g of a resol type phenolic resin, 0.3 g of triethanolamine and 2 g of butyl carbitol. The resulting mixture was applied as electrodes by screen printing on both ends of a carbon resistor printed and cured on a polyimide resin substrate, and was heat-cured at 150° C. for 30 minutes in nitrogen. As a result of measurement carried out for the cured film thus formed, the attainment of sufficient ohmic contacts could be confirmed.

[Comparative Examples]

Comparative Examples of Powder Production

Comparative Example 1

In a graphite crucible, 317.46825 g of copper particles and 0.05395 g of silver particles were heated up to 1700° C. by high-frequency induction heating to be melted. The heating was conducted in a nitrogen (99% or more) atmosphere. The melt was jetted into an inert atmosphere (nitrogen) from a nozzle attached to the end of the crucible. Simultaneously with the jetting, nitrogen (99.9% or more) was jetted with a gas pressure of 20 k/cm²G against the melt at a mass velocity ratio of the gas to the melt of 2 to atomize the melt. In this case, the linear velocity of the gas at the outlet of a gas nozzle was 100 m/sec. The powder thus obtained had an average particle size of 19 μm. The average silver concentration was x=0.0001 and the average copper concentration was y=0.9999.

Comparative Example 2

In the same manner as in Comparative Example 1 0.03175 g of copper particles and 539.446 g of silver particles were heated up to 1720° C. by high-frequency induction heating to be melted. Simultaneously with jetting the melt, nitrogen gas (99.9% or more) was jetted with a gas pressure of 20 k/cm²G against the melt at a mass velocity ratio of the gas to the melt of 2 to atomize the melt. In this case, the linear velocity of the gas at the outlet of a gas nozzle was 110 m/sec. The powder thus obtained had an average particle size of 18 μm. The average silver concentration was x=0.9999 and the average copper concentration was y=0.0001.

Referential Example 1

In the same manner as in Comparative Example 1, 285.75 g of copper particles and 53.95 g of silver particles were heated up to 1600° C. to be melted. Simultaneously with jetting the melt, a mixed gas (oxygen 10%, nitrogen 90%) was jetted with a gas pressure of 20 k/cm²G against the melt at a mass velocity ratio of the gas to the melt of 2 to atomize the melt. In this case, the linear velocity of the gas at the outlet of a gas nozzle was 110 m/sec. The silver concentrations near the surface of the powder thus obtained were measured to be 0.08, 0.09, 0.1, 0.11 and 0.13, starting from the surface. Thus, the shorter the distance from the surface, the lower the silver concentration. The silver concentration x in the surface was 0.085, the average silver concentration x=0.1, and the average copper concentration y=0.9. The silver concentration in the surface was 0.85 times as high as the average silver concentration.

Comparative Examples of Pasting

Comparative Example 4

With 10 g of the powder (x=0.0001, y=0.9999) obtained in Comparative Example 1 were thoroughly mixed 3 g of a thermoplastic acrylic resin, 0.01 g of copper linoleate and 3 g of MEK. The resulting mixture was applied on a paper-phenolic resin substrate by spraying. The coating film thus formed was dried at 50° C. for 24 hours. The volume resistivity of the coating film after the drying was as high as $2\times10^3$ Ω.cm. The result of the cross-cut adhesion test was 100/100, but as a result of a humidity resistance test, the percentage change after standing for 1,000 hours was found to be as high as 300%.

A composition obtained in the same manner as described above was introduced into the through holes of 1, 0.5 and 0.3 mmφ of a paper-phenolic resin substrate by screen printing (250 mesh) under a vacuum of 700 mmHg while pulling the substrate from the side reverse to the side on which the screen printing was conducted. The electric resistance of a cured product of the composition between the obverse and the reverse of the substrate was as high as 3 Ω.

Comparative Example 5

With 10 g of particles with a particle size of 10 μm or less among particles constituting the powder (x=0.9999, y=0.0001) produced in Comparative Example 2 were thoroughly mixed 0.1 g of a bisphenol A type epoxy resin and 2 g of butyl carbitol. The resulting mixture was applied on a glass-epoxy resin substrate. The volume resistivity of the coating film thus formed was $5\times10^{-5}$ Ω.cm. As a result of a humidity resistance test, the percentage change was found to be 10% even after standing for 1,000 hours. The result of the cross-cut adhesion test was 100/100. But, the migration time was as short as 15 seconds, thus, migration was liable to occur.

Comparative Example 6

With 10 g of particles with a particle size of 10 μm or less among particles constituting the powder (x=0.01, y=0.99) obtained in Example 2 were mixed 30 g of a resol type phenolic resin and 20 g of ethyl Cellosolve. The resulting mixture was applied on a glass-epoxy resin substrate by screen printing. The coating film thus formed was heat-cured at 150° C. for 30 minutes. The volume resistivity of the cured film was as high as $1\times10^{-2}$ Ω.cm. As a result of a humidity resistance test, the percentage change after standing for 1,000 hours, was found to be as high as 200%. The result of the cross-cut adhesion test was 100/100.

A composition obtained in the same manner as described above was applied on a glass-epoxy resin substrate to form a 10 cm×10 cm×50 μm coating film, which was then heat-cured. The cured film was allowed to stand at 60° C. and 90% RH for 1,000 hours, and the shielding characteristics in the frequency range of 100 kHz to 1 GHz were measured. Consequently, the cured film showed a low shielding effect of only 10 dB.

Comparative Example 7

With 10 g of particles with a particle size of 10 μm or less among particles constituting the powder (x=0.1, y=0.9) obtained in Comparative Example 3 were mixed 0.1 g of a fatty-acid-modified epoxy resin and 0.2 g of pyrocatechol. The resulting mixture was applied on a glass-epoxy resin substrate by screen printing. The coating film thus formed was heat-cured at 140° C. for 30 minutes. The volume resistivity of the cured film was as high as $2\times10^{-2}$ Ω.cm. As a result of a humidity resistance test, the percentage change after standing for 1,000 hours was found to be as high as 250%. Furthermore, the film was easily peelable (cross-cut adhesion test: 3/100).

Comparative Example 8

With 10 g of particles with a particle size of 15 μm or less among particles constituting the powder (x=0.01, y=0.99) obtained in Example 2 were mixed 0.1 g of methylated melamine, 0.1 g of pyrocatechol and 2 g of ethyl Cellosolve. The resulting mixture was applied on a glass-epoxy resin substrate by screen printing. The coating film thus formed was heated and fired at 150° C. for 30 minutes in air. The volume resistivity of the resulting cured film was as high as $1\times10^{-2}$ Ω.cm. The film was easily peelable (cross-cut adhesion test: 10/100). As a result of a humidity resistance test, the percentage change after standing for 1,000 hours was found to be as high as 180%.

Comparative Example 9

In 2 g of butyl carbitol acetate were dispersed 10 g of particles with a particle size of 15 μm or less among particles constituting the powder (x=0.01, y=0.99) obtained in Example 2, 2 g of a resol type phenolic resin and 20 g of triethanolamine. The resulting composition was applied on a glass-epoxy resin substrate by screen printing. The coating film thus formed was heat-cured at 160° C. for 20 minutes. The volume resistivity of the cured film was as high as $2\times10^2$ Ω.cm. As a result of a humidity resistance test, the percentage change after standing for 1,000 hours was found to be as high as 200%. The result of the cross-cut adhesion test was as poor as 30/100.

Comparative Example 10

With 10 g of powder with an average particle size of 10 μm obtained by plating copper powder with silver in an amount of 10 wt % were mixed 2 g of a resol type phenolic resin, 0.8 g of triethanolamine and 2 g of butyl Cellosolve. The resulting mixture was applied on a glass-epoxy resin substrate by screen printing. The coating film thus formed was heat-cured at 150° C. for 20 minutes. The volume resistivity of the cured film was $3\times10^{-3}$ Ω.cm, but the result of the migration test was as short as 15 seconds.

Industrial Applicability

The copper alloy composition of the present invention is excellent in properties, such as electroconductivity, oxidation resistance and migration resistance. Therefore, electromagnetic shielding using this composition, and materials comprising this composition (e.g. electrically conductive adhesive, pastes for conductive circuits, pastes for electrodes, pastes for screen printing, pastes for printing resistance terminals, pastes for through holes, and materials for contact) exhibit excellent performance characteristics.

What is claimed is:

1. An electrically conductive composition comprising 100 parts by weight of powder of a copper and silver alloy represented by the general formula $Ag_xCu_y$ (wherein x and y are atomic ratio values;

$0.001 \leq x \leq 0.999$, $0.001 \leq y \leq 0.999$, $x+y=1$), from 5 to 200 parts by weight of one or more organic binders, and from 0.01 to 100 parts by weight of an additive capable of removing copper oxide.

2. An electrically conductive composition according to claim 1, wherein particles of the copper alloy represented by the general formula $Ag_xCu_y$ have an x value and a y value in the ranges of $0.001 \leq x \leq 0.4$ and $0.6 \leq y \leq 0.999$ (wherein x and y are atomic ratio values), the silver concentration in the surface of each copper alloy particle is higher than the average silver concentration, and the particles have a region near the surface in which the silver concentration increases with a decrease of the distance to the surface.

3. An electrically conductive composition according to claim 2, wherein the silver concentration in the surface of the copper alloy particle is 2.1 times as high as the average silver concentration.

4. An electrically conductive composition according to any one of claims 1 to 3, wherein the average particle size of the copper alloy powder is from 1 to 100 microns.

5. A copper alloy powder comprising particles of an alloy of copper and silver in a ratio represented by the formula: $Ag_xCu_y$ (wherein x and y are atomic ratio values; $0.001 \leq x \leq 0.999$, $0.001 \leq y \leq 0.999$, $x+y=1$), the particles having an average particle size of from 0.1 to 100 μm and having a surface silver concentration which is at least 2.1 times the average particle silver concentration, the particle silver concentration decreasing with distance from the particle surface.

6. An electrically conductive composition comprising 100 parts by weight of copper alloy powder according to claim 5, from 5 to 200 parts by weight of one or more organic binders and from 0.01 to 100 parts by weight of an additive capable of removing copper oxide.

7. An electrically conductive composition according to one of claims 1 and 6 wherein the copper alloy powder is produced by atomization.

8. An electrically conductive composition according to one of claims 1 and 6 wherein the organic binder comprises at least one member selected from the group consisting of thermosetting resin, thermoplastic resin, electron-beam-setting resin, photo-setting resin, electron beam degradable resin, and photo-degradable resin.

9. An electrically conductive composition according to one of claims 1 and 6, the additive capable of removing copper oxide comprises at least one member selected from the group consisting fatty acid and metal salt thereof, dicarboxylic acid, oxycarboxylic acid, a phenol, metal-chelate-forming agent, higher fatty amine, organotitanate compound, rosin, and anthracene and a derivative thereof.

10. A molded article obtained by printing an electrically conductive composition claimed in one of claims 1 and 6 on at least one hard and flexible substrate selected from the group consisting of a glass-epoxy resin, paper-phenolic resin, paper-epoxy resin, polyester resin, polysulfone resin, polyether-imide resin, polyimide resin, BT resin, polyether sulfone resin, glass-polyimide resin, polybutadiene resin, polyphenylene ether resin, polyphenylene sulfide resin, fluororesin, alumina, aluminum nitride, aluminum, or stainless steel.

11. A paste for screen printing which comprises an electrically conductive composition claimed in one of claims 1 and 6.

12. A paste for electromagnetic shielding which comprises an electrically conductive composition claimed in one of claims 1 and 6.

13. A paste for a conductive circuit which comprises an electrically conductive composition claimed in one of claims 1 and 6.

14. A electrically conductive paste comprising an electrically conductive composition claimed in one of claims 1 and 6.

15. A paste for an electrode which comprises an electrically conductive composition claimed in one of claims 1 and 6.

16. A paste for a through hole which comprises an electrically conductive composition claimed in one of claims 1 and 6.

* * * * *